(12) United States Patent
Scheuregger et al.

(10) Patent No.: US 12,610,205 B2
(45) Date of Patent: Apr. 21, 2026

(54) ADAPTIVE LOUDSPEAKER AND LISTENER POSITIONING COMPENSATION

(71) Applicant: Bang & Olufsen A/S, Struer (DK)

(72) Inventors: Oliver Scheuregger, Valby (DK); Lyle Bruce Clarke, Lunderskov (DK); Neo Kaplanis, Welwyn Garden City (GB); Ion Sircu, Lyngby (DK)

(73) Assignee: Bang & Olufsen A/S, Struer (DK)

( * ) Notice: Subject to any disclaimer, the term of this patent is extended or adjusted under 35 U.S.C. 154(b) by 556 days.

(21) Appl. No.: 18/064,004

(22) Filed: Dec. 9, 2022

(65) Prior Publication Data

US 2024/0196150 A1     Jun. 13, 2024

(51) Int. Cl.
| | |
|---|---|
| *H04S 7/00* | (2006.01) |
| *G06F 3/16* | (2006.01) |
| *H03G 3/30* | (2006.01) |

(52) U.S. Cl.
CPC .............. *H04S 7/302* (2013.01); *G06F 3/165* (2013.01); *H03G 3/3005* (2013.01)

(58) Field of Classification Search
CPC . H04S 7/302; H04S 7/30; H04S 7/301; H04S 7/004; H04S 1/002; H04S 5/005; H04S 2420/01; G06F 3/165; H03G 3/3005; H04R 5/02
USPC .......................................... 381/303, 310, 61
See application file for complete search history.

(56) References Cited

U.S. PATENT DOCUMENTS

| | | | |
|---|---|---|---|
| 6,144,747 A | 11/2000 | Scofield et al. | |
| 10,251,012 B2 | 4/2019 | Schaefer | |
| 11,789,525 B1 * | 10/2023 | Kouxommone | ........ G06F 3/038 |
| | | | 345/102 |

(Continued)

FOREIGN PATENT DOCUMENTS

WO          2022124620 A1      6/2022

OTHER PUBLICATIONS

"10 Things you need to know about Next Generation Audio," EBU Operating Eurovision and Euroradio, Date Accessed: Feb. 10, 2023, pp. 1-30.

(Continued)

*Primary Examiner* — Ahmad F. Matar
*Assistant Examiner* — Sabrina Diaz
(74) *Attorney, Agent, or Firm* — Patterson + Sheridan, LLP

(57)          ABSTRACT

The disclosure provides an approach for adaptive loudspeaker and listener positioning compensation. A method of adaptively correcting a sound image is provided. The method includes obtaining an audio signal associated with one or more audio channels and each audio channel is associated with a position of an audio source with respect to a reference point within a local reproduction system. The method includes determining dynamic position information. The dynamic position information includes positions of one or more loudspeakers within the local reproduction system relative to the reference point, a position of a listener relative to the reference point, positions of the one or more loudspeakers relative to the listener, or a combination thereof. The method includes applying one or more correction gains and one or more correction time delays to the audio signal based on the dynamic position information and rendering the audio signal to the local reproduction system.

17 Claims, 11 Drawing Sheets

(56)    References Cited

U.S. PATENT DOCUMENTS

| | | | |
|---|---|---|---|
| 2009/0123007 A1* | 5/2009 | Katayama | H04S 7/302 |
| | | | 381/300 |
| 2011/0069841 A1 | 3/2011 | Angeloff et al. | |
| 2015/0016642 A1* | 1/2015 | Walsh | H04S 7/301 |
| | | | 381/307 |
| 2016/0150346 A1 | 5/2016 | Reuss | |
| 2019/0075418 A1* | 3/2019 | Shi | H04S 7/303 |
| 2021/0168552 A1* | 6/2021 | Walther | H04R 5/04 |

OTHER PUBLICATIONS

Peter, "What is . . . Higher Order Ambisonics?" SSA Plugins, Dated: Jul. 18, 2017, pp. 1-7.

European Patent Office, Extended European Search Report for European Patent Application No. 23215341.1, dated Apr. 16, 2024.

* cited by examiner

100

145

Server

140

Network

125 d_correct d_correct

110

105

300

300

300

145

Server

140

Network

115

125

125

120

650

110

105

300

145

Server

140

Network

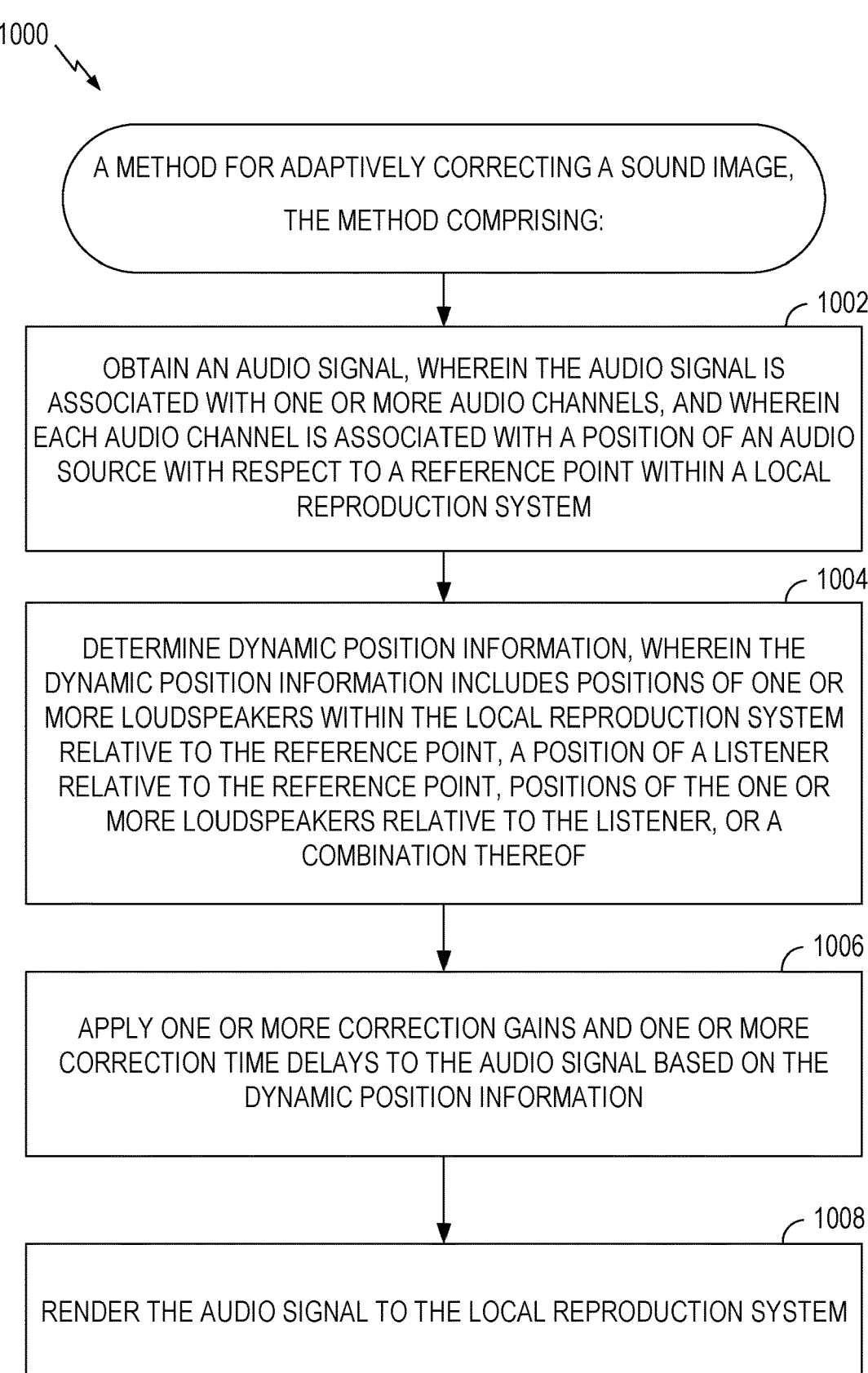

1000

A METHOD FOR ADAPTIVELY CORRECTING A SOUND IMAGE, THE METHOD COMPRISING:

1002

OBTAIN AN AUDIO SIGNAL, WHEREIN THE AUDIO SIGNAL IS ASSOCIATED WITH ONE OR MORE AUDIO CHANNELS, AND WHEREIN EACH AUDIO CHANNEL IS ASSOCIATED WITH A POSITION OF AN AUDIO SOURCE WITH RESPECT TO A REFERENCE POINT WITHIN A LOCAL REPRODUCTION SYSTEM

1004

DETERMINE DYNAMIC POSITION INFORMATION, WHEREIN THE DYNAMIC POSITION INFORMATION INCLUDES POSITIONS OF ONE OR MORE LOUDSPEAKERS WITHIN THE LOCAL REPRODUCTION SYSTEM RELATIVE TO THE REFERENCE POINT, A POSITION OF A LISTENER RELATIVE TO THE REFERENCE POINT, POSITIONS OF THE ONE OR MORE LOUDSPEAKERS RELATIVE TO THE LISTENER, OR A COMBINATION THEREOF

1006

APPLY ONE OR MORE CORRECTION GAINS AND ONE OR MORE CORRECTION TIME DELAYS TO THE AUDIO SIGNAL BASED ON THE DYNAMIC POSITION INFORMATION

1008

RENDER THE AUDIO SIGNAL TO THE LOCAL REPRODUCTION SYSTEM

FIG. 10

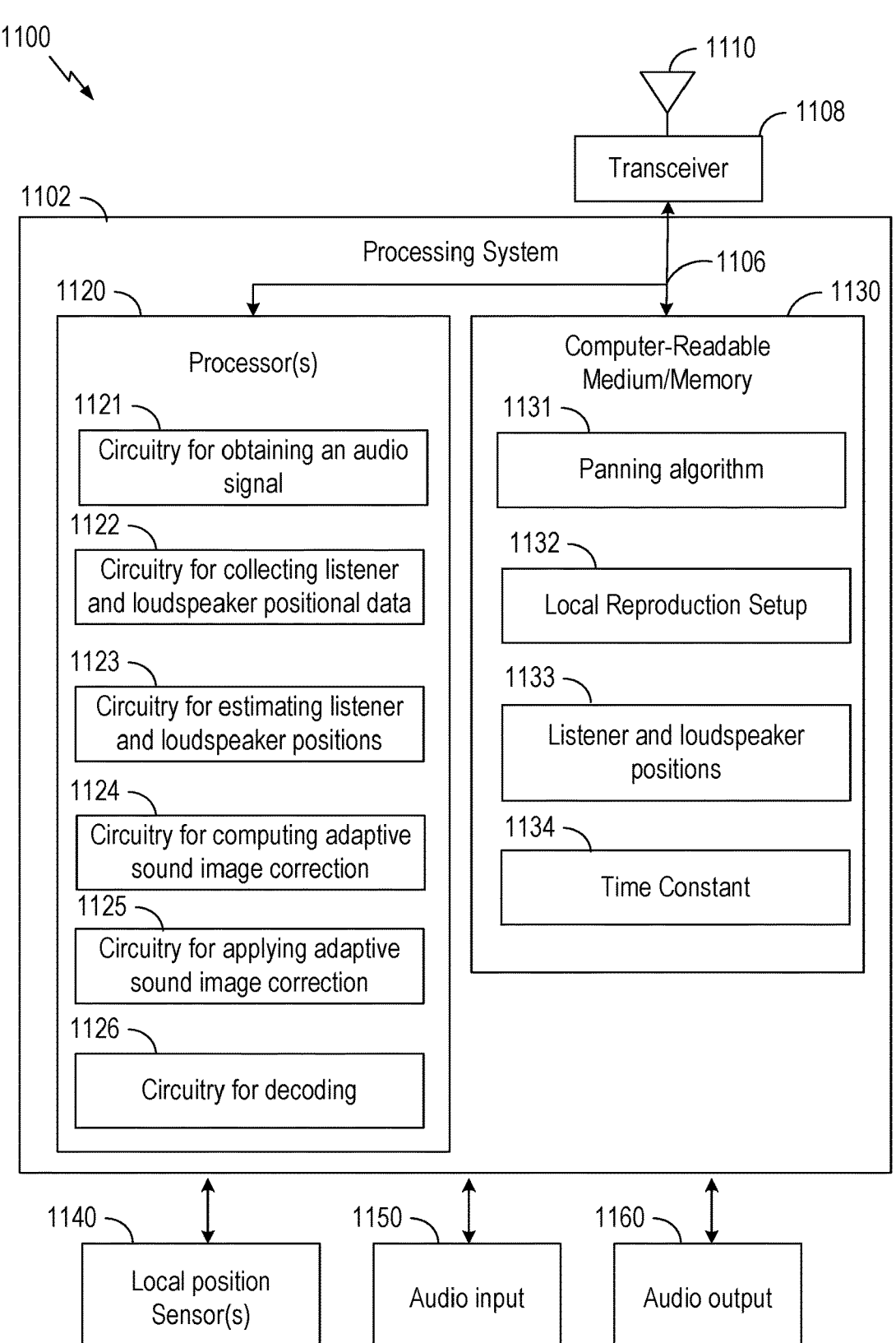

1100

1110

1108

Transceiver

1102

Processing System

1106

1130

1120

Processor(s)

1121

Circuitry for obtaining an audio signal

1122

Circuitry for collecting listener and loudspeaker positional data

1123

Circuitry for estimating listener and loudspeaker positions

1124

Circuitry for computing adaptive sound image correction

1125

Circuitry for applying adaptive sound image correction

1126

Circuitry for decoding

Computer-Readable Medium/Memory

1131

Panning algorithm

1132

Local Reproduction Setup

1133

Listener and loudspeaker positions

1134

Time Constant

1140

Local position Sensor(s)

1150

Audio input

1160

Audio output

*FIG. 11*

ADAPTIVE LOUDSPEAKER AND LISTENER POSITIONING COMPENSATION

INTRODUCTION

Field of the Disclosure

The present disclosure is related to sound reproduction systems and, more specifically, to reproduction of sound fields with adaptive loudspeaker and listener positioning compensation.

Background

Stereophonic sound, more commonly known as "stereo", is a method of sound reproduction that uses at least two independent audio channels, through a configuration of at least two loudspeakers (or alternatively, a pair of two-channel headphones), to create a multi-directional and three-dimensional audio perspective that provides an audio experience to the listener that creates the impression of sound heard from various directions, as in natural hearing.

Surround sound refers to stereo systems using more than two audio channels, more than two loudspeakers, or both, to enrich the depth and fidelity of the sound reproduction. Stereo sound can be captured as live sound (e.g., using an array of microphones), with natural reverberations present, and then reproduced over multiple loudspeakers to recreate, as close as possible, the live sound. Pan stereo refers to a single-channel (mono) sound that is then reproduced over multiple loudspeakers. By varying the relative amplitude of the signal sent to each speaker, an artificial direction (relative to the listener) can be created.

One type of stereo audio is referred to as mid/side (M/S). A bidirectional microphone (e.g., with a figure eight pattern) facing sideways and a cardioid facing the sound source can be used to record mid/side audio. The "left" and "right" audio channels are encoded through a simple matrix: Left=Mid+Side and Right=Mid−Side, where "minus" means adding the side signal with the polarity reversed. The stereo width, and thereby the perceived distance of the sound source, can be manipulated after the recording.

Panning algorithms are capable of redistributing audio signals across a given array of transducers. Panning algorithms are used in both the creation of audio content (e.g., a studio mixing desk will typically have stereo pan-pots to position an audio signal across the left-right dimension), as well as in the rendering of audio (e.g., in consumer loudspeaker setups). Examples of panning algorithms include, but are not limited to, Vector Base Amplitude Panning (VBAP), Ambisonic panning (e.g., Ambisonic Equivalent Panning (AEP)), Distance Base Angular Panning (DBAP), Layer Base Amplitude Panning (LBAP), Dual Band Vector Base Panning (VBP Dual-Band), K-Nearest Neighbor (KNN) panning, Speaker-Placement Correction Amplitude (SPCAP) panning, Continuous Surround Panning (CSP), Angular and PanR panning, In today's media-driven society, there are increasingly more ways for users to access video and audio, with a plethora of products producing sound in the home, car, or almost any other environment. Portable products producing audio, such as, for example, phones, tablets, laptops, headphones, portable loudspeakers, soundbars, and many other devices, are ubiquitous. These products for producing sounds may include, for example, a large variety of audio such as music, speech, podcasts, sound effects, and audio associated with video content.

Next Generation Audio (NGA) refers to developments in technologies that strive to create audio systems which are immersive, providing a user an enhanced immersive auditory experience; adaptive, capable of adapting to different acoustic environments, different listener/speaker locations, and different listening contexts; and interactive, allowing users to make conscious decisions to interact with the system such that the auditory experience is modified in a way that is intuitive and expected by the user. NGA technologies include, for example, rendering technologies, focused on digital processing of audio signals to improve the acoustic experience of the listener; user interaction technologies, focused on mapping user-driven actions to changes in the auditory experience; and experiential technologies, focused on using technology to deliver new auditory experiences.

One NGA technology is Object-Based Audio, which consists of audio content together with metadata that tells the receiver device how to handle the audio. For example, in a traditional audio production process, many audio sources (e.g., microphones) are used to capture sound, and the audio sources can then be mixed down to a fewer number of channels which represent the final speaker layout, referred to as "downmixing". For example, a hundred (100) microphones may be used to capture the sound played by an orchestra and then mixed down to two audio channels—one for "left" and one for "right" (to be reproduced by two loudspeakers in a stereo system). With Object-Based Audio, the sound sources can be grouped, or isolated, into audio feeds that constitute separate, logical audio objects. For example, the different audio feeds might correspond to different individual voices or instruments, different sound effects (e.g., like a passing vehicle). An audio feed for a group of microphones can make up a logical entity (e.g., a string section or a drum kit). Each feed is distributed as a separate object made of the audio and the metadata containing descriptive data describing the audio, such as the audio's spatial position, the audio level, and the like. The metadata can be modified by a user, allowing the user to control how that audio stream is reproduced.

Another example of NGA technology is Immersive Audio, which augments horizontal surround sound with the vertical dimension (i.e., height). Immersive audio formats may be encoded as either channel-based systems or sound-scene-based systems. In the case of channel-based systems, a number of audio channels contain the audio signals, where each channel is assigned to a discrete physical loudspeaker in the reproduction setup. This is identical to how "non-immersive" channel-based audio formats (e.g., stereo, 5.1) are represented, the only difference being the number of channels available and the number of physical loudspeakers able to reproduce the sound field. Examples include 22.2 and 10.2 systems, as described in the ITU-R BS 0.2159-9.

Soundscene-based audio formats encode an acoustic sound field which can later be decoded to a specified loudspeaker array and/or headphone format. One sound-scene-based method is Ambisonics, which encodes a sound field above and below the listener in addition to in the horizontal plane (e.g., front, back, left, and right). Ambisonics can be understood as a three-dimensional extension of mid/side stereo that adds additional channels for height and depth. Ambisonics is a technique storing and reproducing a sound field at a particular point with spatial accuracy. The degree of accuracy to which the sound field can be reproduced depends on multiple factors, such as the number of loudspeakers available at the reproduction stage, how much storage space is available, computing power, download/ transmission limits, etc. Ambisonics involves encoding a sound field to create a set of signals, referred to as audio channels, that depends on the position of the sound, with the audio channels weighted (e.g., with different gains) depending on the position of the sound source. A decoder then decodes the audio channels to reproduce the sound field. Loudspeaker signals can be derived using a linear combination of the Ambisonic component signals.

As discussed herein, faithful reproduction of an audio signal relies on the user having a local reproduction system setup very similar to the setup that is used in the production stage of the audio. In general, the process of audio reproduction involves the mapping of a set of input audio signals with a target spatial position, relative to reference point, to a set of output audio channels which are to be reproduced by a loudspeaker array comprising a number of real loudspeakers with their own spatial positions. Where the target spatial positions of the input signals match the spatial positions of the real loudspeakers of the loudspeaker array, and the listener's position matches the reference position, the audio can be reproduced by the loudspeakers with a high level of fidelity. In some cases, however, the loudspeakers are incorrectly placed and/or the listener is not in an expected position (e.g., is not positioned at the reference point). In this case, there is an error between the target spatial positions of the audio and the real spatial positions of the loudspeakers in a local reproduction setup and/or there is an error in the relative speaker-listener location(s).

As used herein, incorrect loudspeaker positioning refers to loudspeaker positioning that generates an inaccurate or degraded sound image. In some examples, incorrect loudspeaker positioning may occur when the loudspeakers are positioned according to a non-standardized positioning, such as a loudspeaker placement that does not conform to the ITU-R recommended positioning (e.g., such as those specified in ITU-R 775). It is common in domestic setups that the user neglects (intentionally or unintentionally) to correctly calibrate and arrange the loudspeakers according to the relevant standards. In some aspects, the incorrect loudspeaker positioning is a loudspeaker positioning where the loudspeaker is either closer or further from a listener than a target (e.g., a configured, specified, or threshold) listener-loudspeaker separation distance. In some aspects, the target listener-loudspeaker separation distance is an absolute value. In some aspects, the incorrect loudspeaker positioning is a loudspeaker positioning where the loudspeaker is either closer or further from a listener than another loudspeaker (e.g., the loudspeakers have different relative listener-loudspeaker separation distances).

As used herein, incorrect listener positioning refers to listener positioning relative to loudspeaker positions or listener positioning relative to a reference user positioning that results in an inaccurate or degraded sound image perceived by the listener. In some examples, incorrect listener positioning may occur when the listener is positioned according to a non-standardized positioning, such as a listener position that does not conform to the ITU-R recommended reference position (e.g., such as those specified in ITU-R 775). It is common in domestic setups that the user neglects positioning them self (intentionally or unintentionally) correctly according to the relevant standards. In some aspects, the incorrect listener positioning is a listener positioning where the listener is either closer or further from a loudspeaker than a target (e.g., a configured, specified, or threshold) listener-loudspeaker separation distance. In some aspects, the incorrect listener positioning is a listener positioning where the listener is either closer or further from a loudspeaker than another loudspeaker (e.g., the listener and loudspeakers have different relative listener-loudspeaker separation distances).

Where the loudspeakers are incorrectly placed and/or where the listener is not located in the correct position, the listener may not perceive the audio experience as intended, thereby degrading the listening experience.

Accordingly, techniques and apparatus for improving the user experience where the relative loudspeaker and user positions are incorrect are needed.

SUMMARY

The technology described herein provides a method of adaptive loudspeaker and listener positioning compensation.

A method of adaptively correcting a sound image is provided. The method includes obtaining an audio signal. The audio signal is associated with one or more audio channels and each audio channel is associated with a position of an audio source with respect to a reference point within a local reproduction system. The method includes determining dynamic position information. The dynamic position information includes positions of one or more loudspeakers within the local reproduction system relative to the reference point, a position of a listener relative to the reference point, positions of the one or more loudspeakers relative to the listener, or a combination thereof. The method includes applying one or more correction gains and one or more correction time delays to the audio signal based on the dynamic position information. The method includes rendering the audio signal to the local reproduction system.

Other aspects provide: an apparatus operable, configured, or otherwise adapted to perform any one or more of the aforementioned methods and/or those described elsewhere herein; a non-transitory, computer-readable media comprising instructions that, when executed by a processor of an apparatus, cause the apparatus to perform the aforementioned methods as well as those described elsewhere herein; a computer program product embodied on a computer-readable storage medium comprising code for performing the aforementioned methods as well as those described elsewhere herein; and/or an apparatus comprising means for performing the aforementioned methods as well as those described elsewhere herein. By way of example, an apparatus may comprise a processing system, a device with a processing system, or processing systems cooperating over one or more networks.

The following description and the appended figures set forth certain features for purposes of illustration.

BRIEF DESCRIPTION OF THE DRAWINGS

The appended figures depict certain features of the various aspects described herein and are not to be considered limiting of the scope of this disclosure.

FIG. 1 depicts a diagram of an example multimedia system and sound field, according to one or more aspects.

FIG. 9 depicts an example workflow for adaptive sound image correction, according to one or more aspects.

FIG. 10 depicts an example flow diagram for adaptive loudspeaker and listener positioning compensation, according to one or more aspects.

FIG. 11 depicts an example device for adaptive loudspeaker and listener positioning compensation, according to one or more aspects.

DETAILED DESCRIPTION

Figure 2:
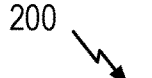
FIG. 2 depicts an example local reproduction setup in the multimedia system of FIG. 1, according to one or more aspects.

The present disclosure provides an approach for adaptive sound field correction for loudspeaker and listener positioning compensation.

In some aspects, positional data of one or more loudspeakers within a local reproduction setup, positional data of a listener, or both, are dynamically collected and used for the adaptive sound field correction. In some examples, real-time positional data is collected (e.g., continuously, periodically, responsive to a trigger, or on-demand). In some aspects, a time constant is applied to the collected raw loudspeaker and/or listener positioning data to smooth the raw data. In some aspects, the raw positioning data is positioning data of the loudspeakers relative to a reference point, relative to another loudspeaker, or relative to the listener. In some aspects, the raw positioning data is positioning data of the listener relative to a reference point or relative to one or more loudspeakers. In some aspects, the listener and/or loudspeaker positions are dynamically determined as Cartesian coordinates (e.g., x- and y-coordinates or x-, y-, and z-coordinates) or as spherical coordinates (e.g., Azimuth (degrees), Elevation (degrees) and Distance (meters)).

In some aspects, the positional data is used to adaptively correct the sound field generated by the one or more loudspeakers to compensate for incorrect loudspeaker and/or listener positioning. In some aspects, a target separation distance between a listener and the loudspeakers is specified. When the collected positional data indicates the listener-loudspeaker separation distance is smaller or larger than the target separation distance, the sound field can be adaptively corrected to compensate for the difference between the measured or computed listener-loudspeaker separation distance and the target separation distance. In some cases, the target separation distance may be defined based on the resolution and/or accuracy of the positioning technology used to detect the listener and/or loudspeaker positions. For example, a low target separation distance may be chosen if the positioning technology is extremely accurate and higher target separation distance may be chosen if the positioning technology is less accurate. In other cases, the target separation distance may be defined by perceptual thresholds, whereby the separation distance is chosen to be of a magnitude at which a typical human may begin to hear degradations in the sound image. In some aspects, the relative listener-loudspeaker separation distance is measured directly or is computed based on the respective listener positioning data and loudspeaker positioning data.

In some aspects, adaptively correcting the sound image includes applying one or more corrective gains and/or one or more corrective time delays to an input audio signal. In some aspects, the one or more corrective gains and/or one or more corrective time delays are applied to an audio signal before rendering the audio signal to a local reproduction system to compensate for the incorrect listener-loudspeaker positioning such that the sound field generated by the loudspeakers matches the target or desired sound image generated at the target listener-loudspeaker separation distance. In some aspects, the one or more corrective gains and/or the one or more corrective time delays to apply to the audio signal(s) to compensate for the incorrect listener-loudspeaker separation distance may be determined based on a function, a mapping, or a look-up table that associates different corrective gains and corrective time delays to difference values.

Example System with Adaptive Loudspeaker and Listener Positioning Compensation

Aspects of the disclosure for adaptive sound field correction to compensate incorrect loudspeaker and listener positioning may be performed when a user is consuming audio content. In some cases, a user consumes both audio content and associated visual content. Audio content or audio-visual content may be provided by a multimedia system. While aspects of the disclosure are described with respect to a multimedia system, it should be understood that the aspects described herein equally apply to any local reproduction setup.

Figure 1:
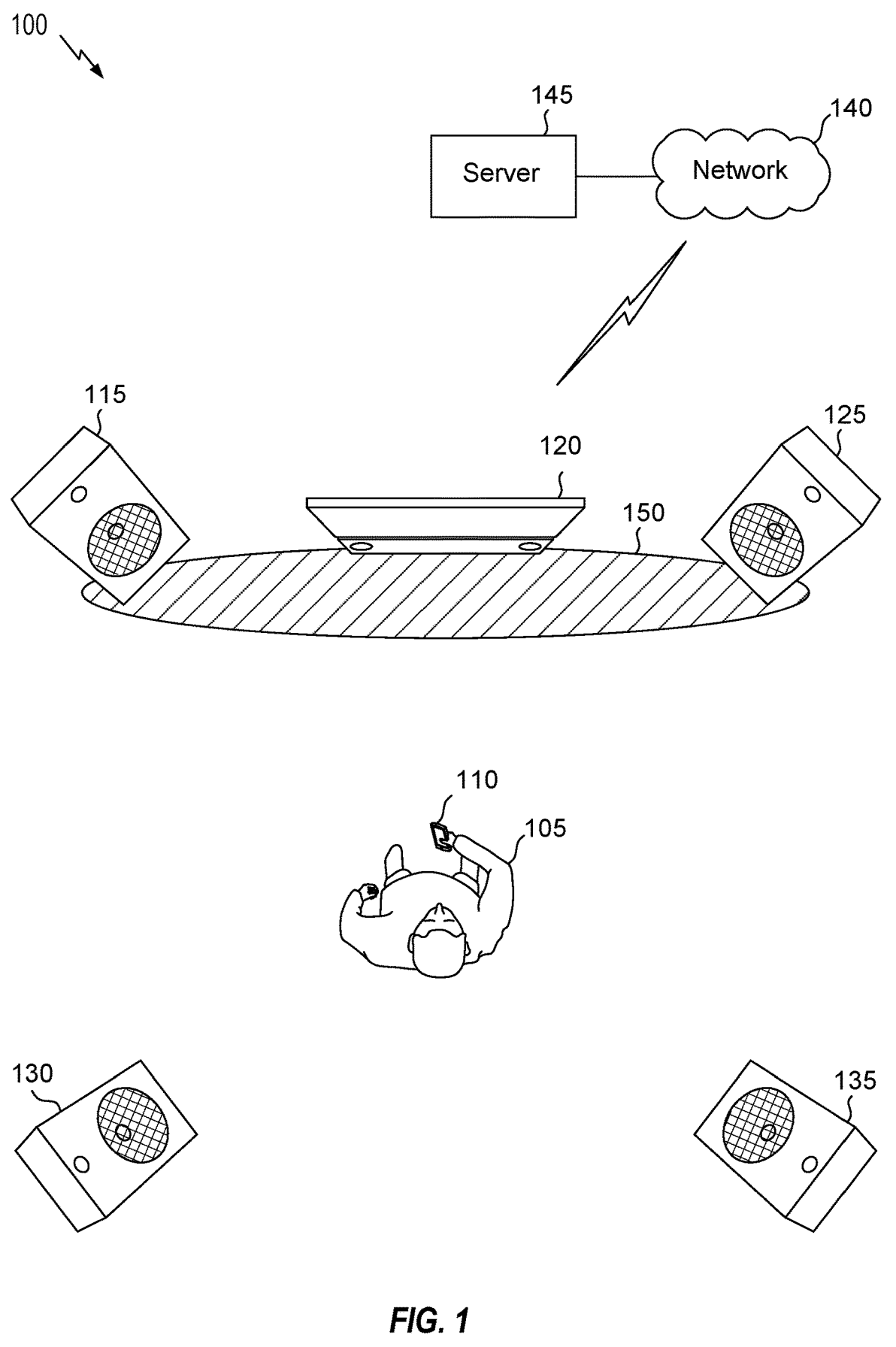

FIG. 1 depicts example multimedia system 100 in which aspects of the present disclosure may be implemented. Multimedia system 100 may be located in any environment, such as in a home (e.g., in a living room or home theater), a yard, a theater, in a vehicle, in an indoor or outdoor venue, or any other suitable location.

A multimedia system generally includes a visual display and acoustic transducers. Multimedia installations typically include a display screen, loudspeakers, and a control unit for providing input to the display screen and to the loudspeakers. The input may be a signal from a television provider, a radio provider, a gaming console, various Internet streaming platforms, and the like. It should be understood that other components may also be included in a multimedia installation.

Both audio and visual systems have the option to be tethered, or not, to the user. As used herein, "tethered" refers to whether the audio-visual content moves relative to the user when the user moves. For example, headphones worn by a user which do not apply dynamic head-tracking processing provide a "tethered" audio system, where the audio does not change relative to the user. As the user moves about, the user continues to experience the audio in the same way. On the other hand, loudspeakers placed in a room may be "untethered" and do not move with the user. Similarly, a pair of headphones which employ dynamic head-tracked binaural rendering would be considered a form of "untethered", albeit one that is simulated. Thus, as the user moves about, the user may experience the audio content differently. Similarly, a television mounted to a wall is an example of an untethered visual system, whereas a screen (e.g., a tablet or phone) held by the user is an example of a tethered visual system. A virtual reality (VR) headset may provide a form of simulated "untethered" video content, in which the user experiences the video content differently as the user moves about. It should be understood that these examples are merely illustrative, and other devices may provide tethered and untethered audio and visual content to a user.

As shown, multimedia system 100 may include loudspeakers 115, 120, 125, 130, and 135. Loudspeakers 115, 120, 125, 130, and 135 may be any electroacoustic transducer device capable of converting an electrical audio signal into a corresponding sound. Loudspeakers 115, 120, 125, 130, and 135 may include one or more speaker drivers, subwoofers drivers, woofer drivers, mid-range drivers, tweeter drivers, coaxial drivers, and amplifiers which may be mounted in a speaker enclosure. Loudspeakers 115, 120, 125, 130, and 135 may be wired or wireless. Loudspeakers 115, 120, 125, 130, and 135 may be installed in fixed positions or moveable. Loudspeakers 115, 120, 125, 130, and 135 may be any type of speakers, such as surround-sound speakers, satellite speakers, tower or floor-standing speakers, bookshelf speakers, sound bars, TV speakers, in-wall speakers, smart speakers, portable speakers. It should be understood that while five loudspeakers are shown in FIG. 1, multimedia system 100 may include fewer or greater number of loudspeakers which may be positioned in multiple different configurations, as discussed in more detail below with respect to FIG. 2.

Multimedia system 100 may include one or more video displays. For example, a video display may be a user device, such as a smartphone or tablet 110 as shown in FIG. 1. It should be understood that a video display may be any type of video display device, such as a TV, a computer monitor, a smart phone, a laptop, a projector, a VR headset, or other video display device.

Although not shown in FIG. 1, multimedia system 100 may include an input controller. The input controller may be configured to receive an audio/visual signal and provide the visual content to a display (e.g., tablet 110 or TV 120) and audio content to the loudspeakers 115, 120, 125, 130, and 135. In some systems, separate input controllers may be used for the visual and for the audio. In some systems, the input controller may be integrated in one or more of the loudspeakers 115, 120, 125, 130, and 135 or integrated in the display device. In some systems, the input controller may be a separate device, such as a set top box (e.g., an audio/video receiver device).

In some aspects, one or more components of the multimedia system 100 may have wired or wireless connections between them. Wireless connections between components of the multimedia system 100 may be provided via a short-range wireless communication technology, such as Bluetooth, WiFi, ZigBee, ultra wideband (UWB), or infrared. Wired connections between components of the multimedia system 100 may be via auxiliary audio cable, universal serial bus (USB), high-definition multimedia interface (HDMI), video graphics array (VGA), or any other suitable wired connection.

In addition, multimedia system 100 may have a wired or wireless connection to an outside network 140, such as a wide area network (WAN). Multimedia system 100 may connect to the Internet via an Ethernet cable, WiFi, cellular, broadband, or other connection to a network. In some aspects, network 140 further connects to a server 145. In some aspects, the input controller may be integrated in the server 145.

Although not shown in FIG. 1, multimedia system 100 may include a renderer. In some aspects, the renderer may be implemented on the input controller. In some aspects, one or more renderers may be implemented in a receiver or decoder (which itself may be implemented in the input controller). The renderer is the component where the audio and its associated metadata are combined to produce the signal that will feed the loudspeakers of the local reproduction setup.

In the case that the local reproduction setup conforms to a known standard layout (e.g., as defined in ITU-R 775.3), the renderer may be pre-programmed with the standard layouts. The renderer is able to map the audio signals to the output loudspeaker signals. In the case that an unknown local reproduction setup is used, the render is provided with information about the local reproduction setup with information, such as (i) the number of loudspeakers and (ii) the positions (e.g., angle and/or distance) of the loudspeakers relative to a reference position.

Although not shown in FIG. 1, multimedia system 100 may include a decoder. In some aspects, the decoder may be implemented with the renderer. In some aspects, the decoder may be implemented on the input controller. The decoder is the component that decodes an audio signal and its associated metadata.

A listener 105 may interact with the multimedia system 100. For example, the listener 105 may consume audio/visual content output by the multimedia system 100. In the example shown in FIG. 1, the listener 105 may listen to sound from the loudspeakers 115, 120, 125, 130, and 135 and may view video on the tablet 110. In some aspects, the listener 105 may also control the multimedia system 100. For example, the listener 105 may position loudspeakers 115, 120, 125, 130, and 135 and/or the video display(s) within the multimedia system 100, and the listener 105 may configure one or more settings of the multimedia system 100.

The number of loudspeakers (five, in the example illustrated in FIG. 1) and positions of loudspeakers within the multimedia system 100 may be referred to herein as the local reproduction setup. The sound output by the local reproduction setup creates what is referred to herein as a sound field 150 or sound image. The sound field 150 refers to the perceived spatial locations of the sound source(s), which may be laterally, vertically, and depth. A surround sound system that provides a good user experience offers good imaging all around the listener. The quality of the sound field arriving at the listener's ear may depend on both the original recording and the local reproduction setup.

Recommended loudspeaker positions are provided by the International Telecommunication Union (ITU) Radiocommunication Sector (ITU-R). For example, ITU-R BS.775-3 provides recommendations for Multichannel stereophonic sound system with and without accompanying picture. In some aspects, a multimedia system 100 may be configured according to the ITU-R recommendations. In some aspects, a multimedia system 100 may not be configured according to the standard ITU-R recommendations, but may be configured at any positions desired by the user (e.g., due to area constraints within a room or environment).

FIG. 2 depicts an example local reproduction setup 200 in the multimedia system 100 of FIG. 1, according to one or more aspects. FIG. 2 illustrates local reproduction setup 200 with the five loudspeakers 115, 120, 125, 130, and 135 of example multimedia system 100, however, as discussed herein, different numbers of loudspeakers may be included in the multimedia system with different arrangements.

As shown, the example local reproduction setup 200 includes three front loudspeakers, 115, 120, and 125, combined with two rear/side loudspeakers 130 and 135. Optionally, there may be an even number of more than two rear-side loudspeakers which may provide a larger listening area and greater envelopment for the user. For example, a seven loudspeaker setup may provide two additional side loudspeakers in addition to the left-rear loudspeaker 130 and the right-rear loudspeaker 135.

In some aspects, center loudspeaker 120 may be integrated in a TV (e.g., a high-definition TV (HDTV)) or a soundbar positioned in-front of or below the TV. The left-front loudspeaker 115 and the right-front loudspeaker 125 are placed at extremities of an arc subtending 60° at the reference listening point. As shown in FIG. 2, the left-front loudspeaker 115 is positioned at –30°, where 0° is defined here as the line from the listener 105 to the center loudspeaker 120, and where the minus angle is defined in the left, or counter-clockwise, direction from the center line. As shown in FIG. 2, the right-front loudspeaker 125 is positioned at +30° from the center line, and where the positive angle is defined in the right, or clockwise, direction from center line. The distance between the left-front loudspeaker 115 and the right-front loudspeaker 125 is referred to as the loudspeaker basewidth (B). Where the center loudspeaker 120 is integrated in a screen, the distance between the reference listening point (e.g., listener 105) and the screen is referred to as the reference distance and may depend on the height (H) and width (β) of the screen. In some aspects, the center and front loudspeakers, 115, 120, and 125 may be positioned at a height approximately equal to a sitting user (e.g., 1.2 meters).

As shown in FIG. 2, the left-rear loudspeaker 130 is positioned between –100° and –120°, e.g., at –110° as shown, and the right-rear loudspeaker 135 is positioned at between +100° and +120°, e.g., +110° from the center line. In some aspects, the side/rear loudspeakers 130 and 135 may be positioned at a height equal or higher than the front loudspeakers and may have an inclination pointing downward. The side/rear loudspeakers 130 and 135 may be positioned no closer to the reference point than the front/center loudspeakers 115, 120, and 125.

In some aspects, for the example local reproduction setup 200, five audio channels may be used for front left (L), front right (R), centre (C), left side/rear (LS), and right side/rear (RS). Additionally, a low frequency effects (LFE) channel may be included. The LFE channels may carry high level (e.g., loud), low frequency sound effects, this channel is indicated by the "0.1" in a "5.1" surround sound format.

Down-mixing (also referred to as downward mixing or downward conversion) or up-mixing (also referred to as upward conversion or upward mixing) can be performed to reduce or increase the number of channels to a desired number based on the number of delivered signals/channels and the number of available reproduction devices. Down-mixing involves mixing a higher number of signals/channels to a lower format with fewer channels, for example, for a local reproduction setup that does not have enough available loudspeakers to support the higher number of signals/channels. Up-mixing may be used when the local reproduction setup has a greater number of available loudspeakers supporting a higher number of signals/channels than the input number of signals/channels. Up-mixing involves generation of the "missing" channels. ITU-R provides example down-mixing equations and example up-mixing equations.

As mentioned above, while local reproduction setup 200 and multimedia system 100 depict five loudspeakers in an example arrangement, a local reproduction setup may include different numbers of loudspeakers in different arrangements. For example, ITU-R provides recommendations for multimedia systems with three, four, five, and seven loudspeakers for mono-channel systems, mono plus mono surround channel systems, two-channel stereo systems, two-channel stereo plus one surround channel systems, three-channel stereo systems, three-channel stereo plus one surround channels systems, and three-channel stereo plus two surround channels systems. Furthermore, as mentioned above, it should be understood that the local reproduction setup of a multimedia system may be configured in a non-standardized loudspeaker arrangement (e.g., configured with any arbitrary arrangement of two or more loudspeakers). In this case, information about the local reproduction setup (e.g., such as, number of loudspeakers, positions of loudspeakers relative to a reference point, etc.) is provided to the system.

With channel-based audio, the channels can be mixed according to a pre-established speaker layout (e.g., stereo, 5.1 surround, or any of the other systems discussed above) and are then distributed (e.g., streamed, stored in a file or DVD, etc.). In a studio, the recorded sounds pass through a panner that controls how much sound should be placed on each output channel. For example, for a 5.1 surround mix and a sound located somewhere between center and right, the panner will place a portion of the signal on the center and right channels, but not on the remaining channels. The outputs of the panners are mixed (e.g., using a bus) before distribution. That is, the left output of all panners is mixed and placed on the left channel, same for the right channel, and so on. During reproduction, each audio signal is sent to the loudspeaker corresponding to the audio signal. For example, the mixed audio signal for (L) is provided to the left-front loudspeaker, the mixed audio signal for (R) is provided to right-front loudspeaker, and so on.

For object-based audio, instead of mixing all sounds in the studio and distributing the final mix, all of the sounds can be independently distributed and then mixed during reproduction. Thus, like for channel-based audio, panners are used during recording to position the sound, but the panning information is not applied to mix the sound at this stage. Instead, metadata is used to indicate where the sounds should be positioned. The metadata is distributed along with the audio channels and during reproduction the panning information is actually applied to the sound based on the actual local reproduction setup. The panning information for a particular object may not be static but changing in time. The panning information may indicate the position of the sound, the size of the sound (e.g., the desired spread or number of loudspeakers for the sound), or other information. Each sound and its corresponding metadata is referred to as an "object."

With object-based audio, the listener 105 can make choices about the configuration of the audio, which can be added to the mix, to optimize the user's experience. For example, the listener 105 can select the audio type (mono, stereo, surround, binaural, etc.), adjust particular audio signals (e.g., turn up the sound for dialogue, where dialogue is provided as an independent object), omit certain audio signals (e.g., turn off commentary on a sports game, where the commentary is provided as an independent object), select certain audio signals (e.g., select a language option for dialogue, where different languages for the dialogue are provided as independent objects), or other user preferences.

As mentioned above, the sounds output by the local reproduction setup produce the sound field 150 (or sound image). In a stereophonic sound reproduction setup including a left and a right loudspeaker (e.g., loudspeakers 115 and 125) radiating sound into a listening area in front of the loudspeakers, optimal stereophonic sound reproduction can be obtained in the symmetry plane between the two loudspeakers (as shown in FIG. 1). If substantially identical signals are provided to the two loudspeakers, a listener (e.g., listener 105) sitting in front of the loudspeakers in the symmetry plane will perceive a sound image in the symmetry plane between the loudspeakers. However, if the listener for instance moves to the right relative to the symmetry plane, the distance between the listener and the right loudspeaker will decrease and the distance between the listener and the left loudspeaker will increase, resulting in that the perceived sound image will move in the direction of the right loudspeaker, even though identical signals are still applied to the two loudspeakers. Similarly, if a loudspeaker is incorrectly positioned with respect to the listener, the separation distance between the listener and the loudspeaker will be incorrect resulting in a degraded sound image. Thus, generally, the perceived position of specific sound images in the total stereo image will depend on the position of the listener relative to the local loudspeaker setup. This effect is, however, not desirable as a stable stereophonic sound image is desired, i.e., a sound image in which the position in space of each specific detail of the sound image remains unchanged when the listener moves in front of the loudspeakers.

Figure 3:
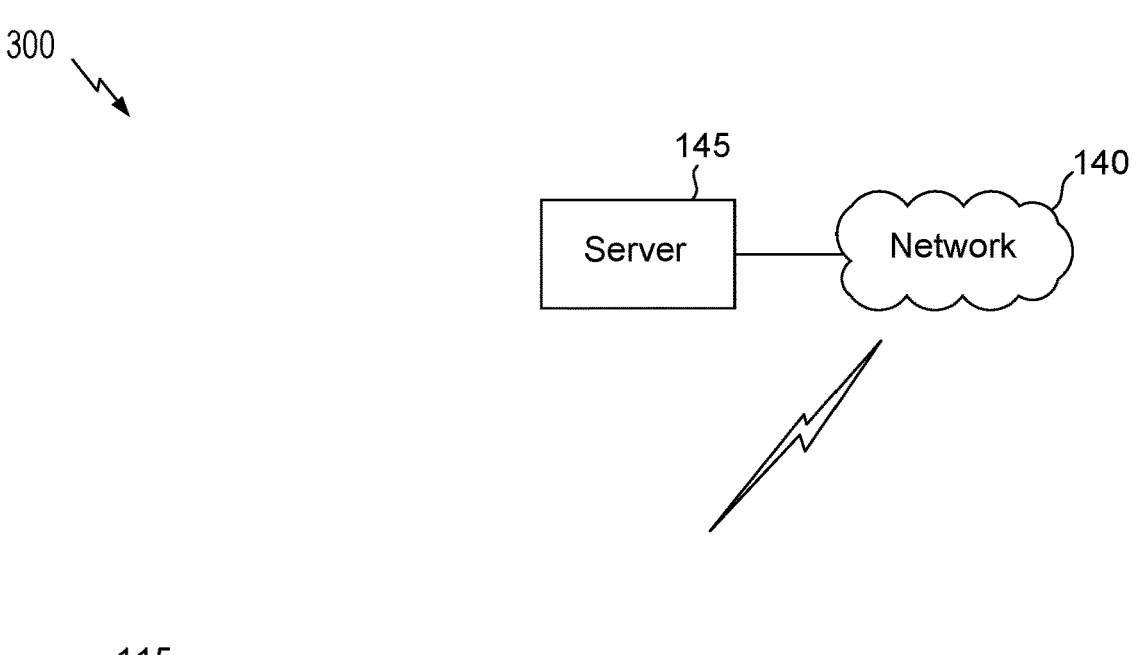
FIG. 3 depicts a block diagram of a target sound field in a multimedia system with correct loudspeaker and listener positioning, according to one or more aspects.
Figure 3:
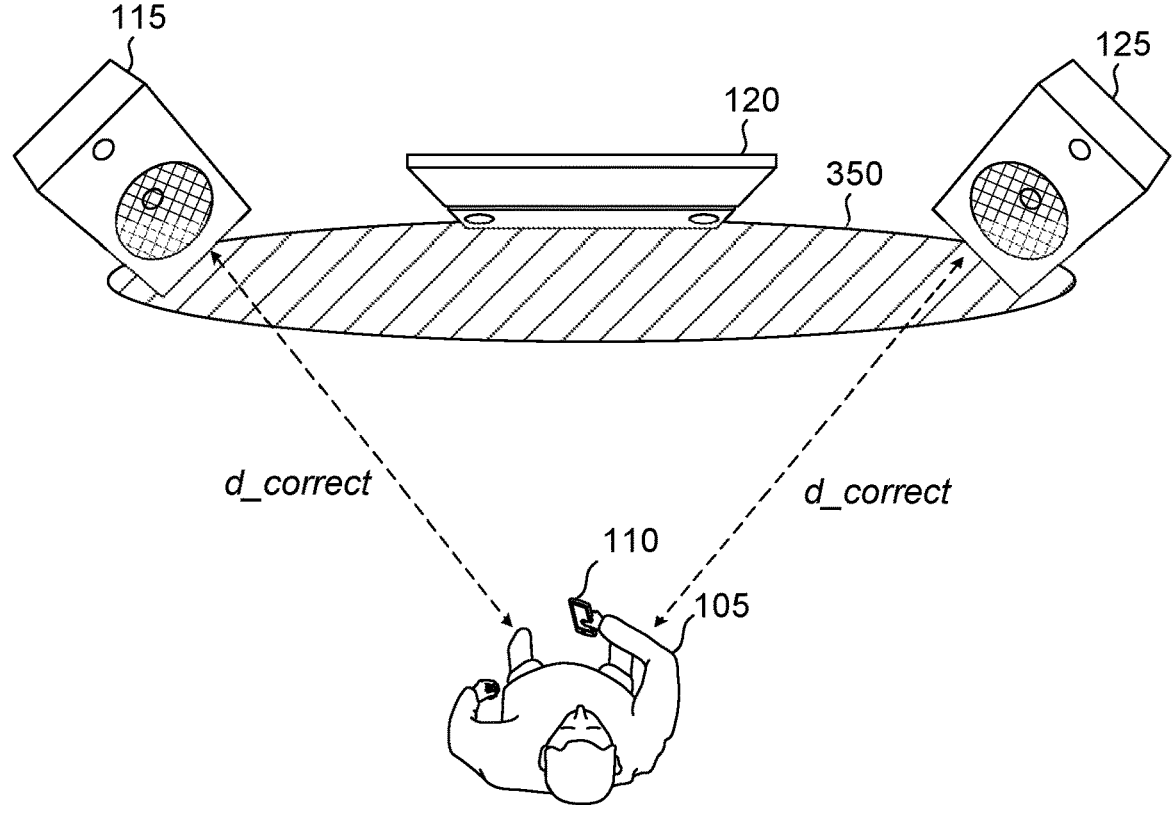

When the loudspeakers are placed with the correct amount of separation distance between the listener and the loudspeakers, a pleasing sound image is generated, resulting in a good user experience. FIG. 3 depicts a block diagram of a target sound field 350 in a multimedia system 300 with correct positioning of the listener 105 and the loudspeakers 115 and 125, according to one or more aspects. As shown in FIG. 3, the loudspeakers 115 and 125 have a correct (or target) separation distance, $d_{correct}$, between them and the listener 105 providing a sound field 350 with a desired sound image for the listener 105. It should be understood that the correct listener-loudspeaker separation distance, $d_{correct}$, may vary depending on the local reproduction setup, such as the size of the speakers and the distance of the speakers to a reference point (e.g., the listener 105 position) as well as the room acoustics.

Figure 4:
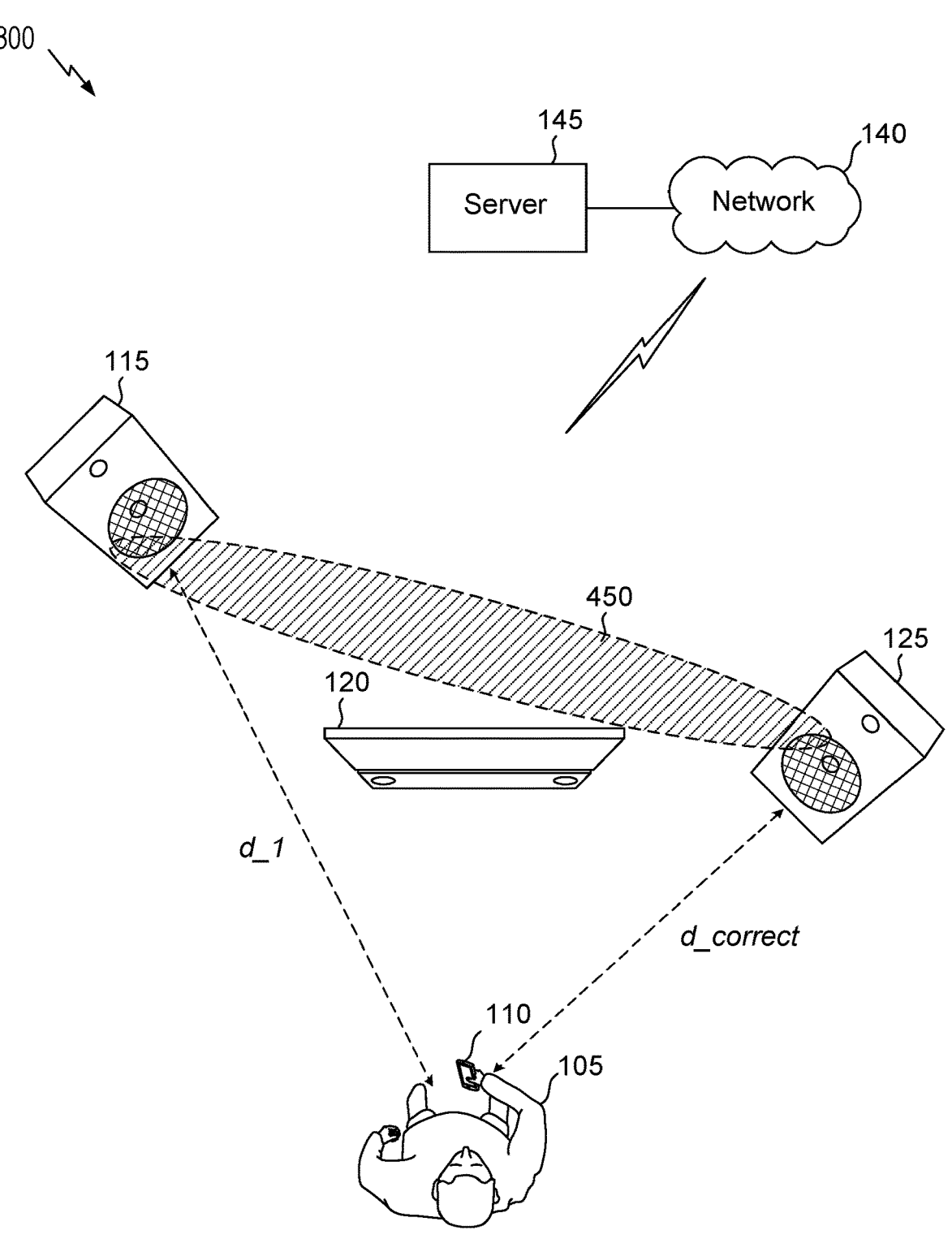
FIG. 4 depicts an example of a sound field in the multimedia system of FIG. 3 with incorrect loudspeaker positioning, according to one or more aspects.

FIG. 4 depicts an example of a degraded sound field 450 in the multimedia system 300 of FIG. 3 with incorrect positioning of the listener 105 and loudspeakers 115 and 125, according to one or more aspects. As shown in FIG. 4, the loudspeaker 115 is positioned too far away from the listener 105 with a separation distance, $d_1$, between them, where $d_1 > d_{correct}$. Accordingly, the sound field 450 does not match the desired sound field 350. The sound field 450 is shifted with respect to the sound field 350 with the desired sound image, with the front right loudspeaker 125 dominating, providing a poor sound image.

Figure 5:
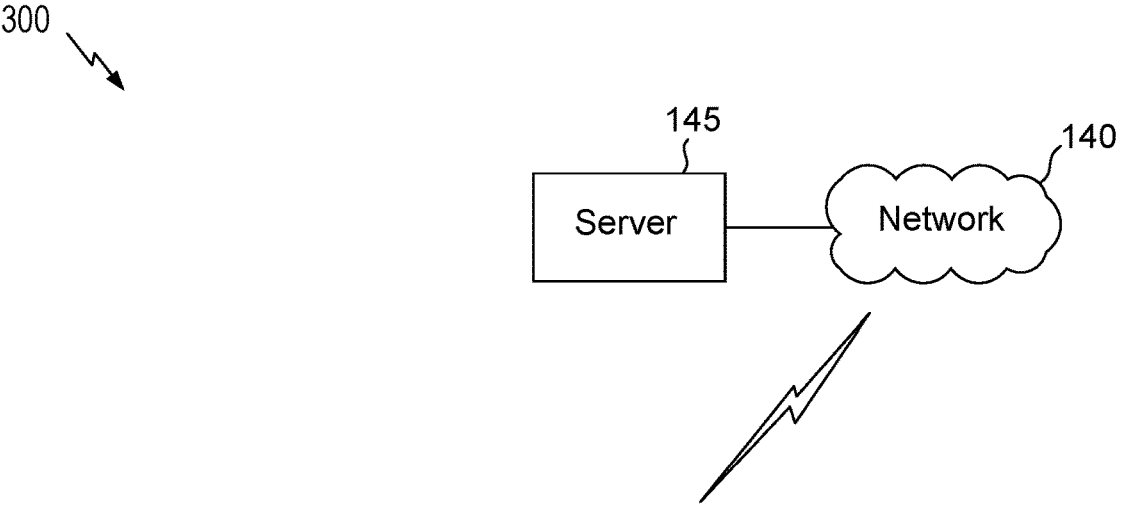
FIG. 5 depicts an example of a sound field in the multimedia system of FIG. 3 with incorrect listener positioning, according to one or more aspects.
Figure 5:
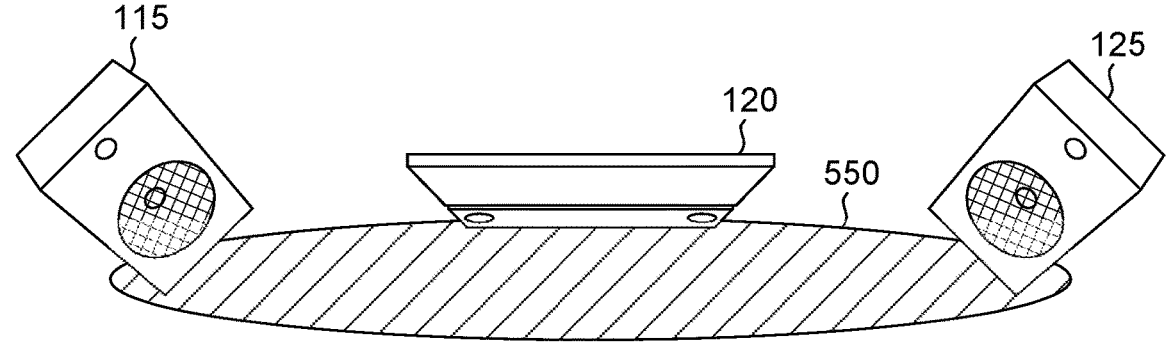
Figure 5:
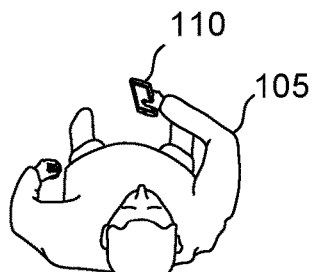

FIG. 5 depicts an example of an incorrectly positioned listener 105 with the loudspeakers 115 and 125 in the multimedia system 300 of FIG. 3, according to one or more aspects. As shown in FIG. 5, the listener 105 is positioned too closely to the loudspeaker 115 and too far from the loudspeaker 125 with separation distances, $d_2$ and $d_3$, respectively, between them, where $d_2 < d_{correct}$ and $d_3 > d_{correct}$. Accordingly, the listener 105 will not correctly perceive the desired sound image. The sound field 550 perceived by the listener 105 is shifted with respect to the sound field 350, with the front left loudspeaker 115 dominating, providing a poor sound image.

While aspects of the present disclosure are discussed with respect to two loudspeakers, the aspects described herein for adaptive sound image correction to compensate for incorrect listener and loudspeaker positioning may be performed for any two speakers in a local reproduction setup including any number of loudspeakers.

Accordingly, incorrect listener and loudspeaker positioning with an error in the listener-loudspeaker separation distance may degrade the user's experience. Consequently, there is a need for a loudspeaker setup that does not suffer from this disadvantageous effect of the incorrectly positioned listener and loudspeakers on the perceived sound image.

Example Adaptive Loudspeaker and Listener Positioning Compensation

Aspects of the present disclosure provide for adaptive sound image correction to compensate for incorrect listener-loudspeaker positioning.

According to certain aspects, the adaptive sound image correction system adapts to the physical distance between the listener and the loudspeakers in a local reproduction setup. For example, the system may apply adaptive amounts of gain and time delay to an audio signal depending of the physical distance between the listener and loudspeakers.

In some aspects, when the listener and loudspeakers are correctly positioned, with a target separation distance between them, the adaptive sound image correction system can be bypassed, as the user perceives the intended sound image. On the other hand, when the listener and/or loudspeakers are incorrectly positioned, with either a too large or too small listener-loudspeaker separation distance, the adaptive sound image correction system applies gain and/or delay to an input audio signal to compensate for the incorrect listener-loudspeaker positioning. According to certain aspects, a panning algorithm is dynamically controlled with dynamic positioning information input to the panning algorithm, where the dynamic positioning information includes spatial positions of the listener and the loudspeakers of the local reproduction system estimated from positioning data collected by local positioning sensors.

The adaptive sound image correction system compensates for the incorrect listener-loudspeaker positioning, such that although the listener and loudspeakers are incorrectly positioned too closely together or too far apart, the adaptively corrected sound field reproduced by the loudspeakers is perceived by the listener 105 with the correct intended sound image, providing an enhanced listening experience for the user.

Referring back to the scenario illustrated in FIG. 3, a correctly positioned listener 105 is consuming audio content from correctly placed loudspeakers 115 and 125 generating the desired sound field 350. Where the loudspeaker 115, the loudspeaker 125, or the listener 105 are incorrectly positioned, the adaptive sound image correction system can adaptively correct the sound image to produce the desired sound image.

Figure 6:
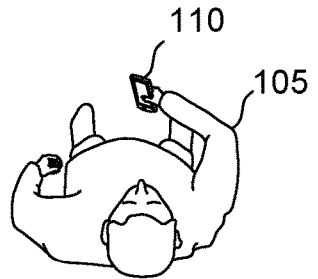
FIG. 6 depicts an example of an adaptively corrected sound field in the multimedia system of FIG. 4 with the incorrect loudspeaker positioning, according to one or more aspects.

FIG. 6 depicts an example of an adaptively corrected sound field 650 in the multimedia system 300 of FIG. 4 with the loudspeaker 115 incorrectly positioned, according to one or more aspects. As shown in FIG. 6, by applying the adaptive sound image correction to compensate for the incorrect positioning of the loudspeaker 115, the corrected sound field 650 is produced which matches the desired sound field 350 as though the loudspeaker 115 were correctly positioned, unlike the degraded sound field 450 produced in FIG. 4 without adaptive sound image correction. For example, the system may apply a negative gain (e.g., to attenuate the audio signal) and a positive time delay to the audio signal. As shown in FIG. 6, applying the adaptive gain and time delay generates the sound field 650, where the loudspeaker 125 is effectively "moved back" to match the listener-loudspeaker separation distance of the loudspeaker 115.

In some aspects, where one loudspeaker is correctly positioned and another loudspeaker is positioned "too closely" (e.g., closer than a configured, specified, target, or threshold listener-loudspeaker separation distance), the adaptive correction shown in FIG. 6 can be applied to effectively "move back" the too closely positioned loudspeaker to match the listener-loudspeaker separation distance of the correctly placed loudspeaker.

Figure 7:
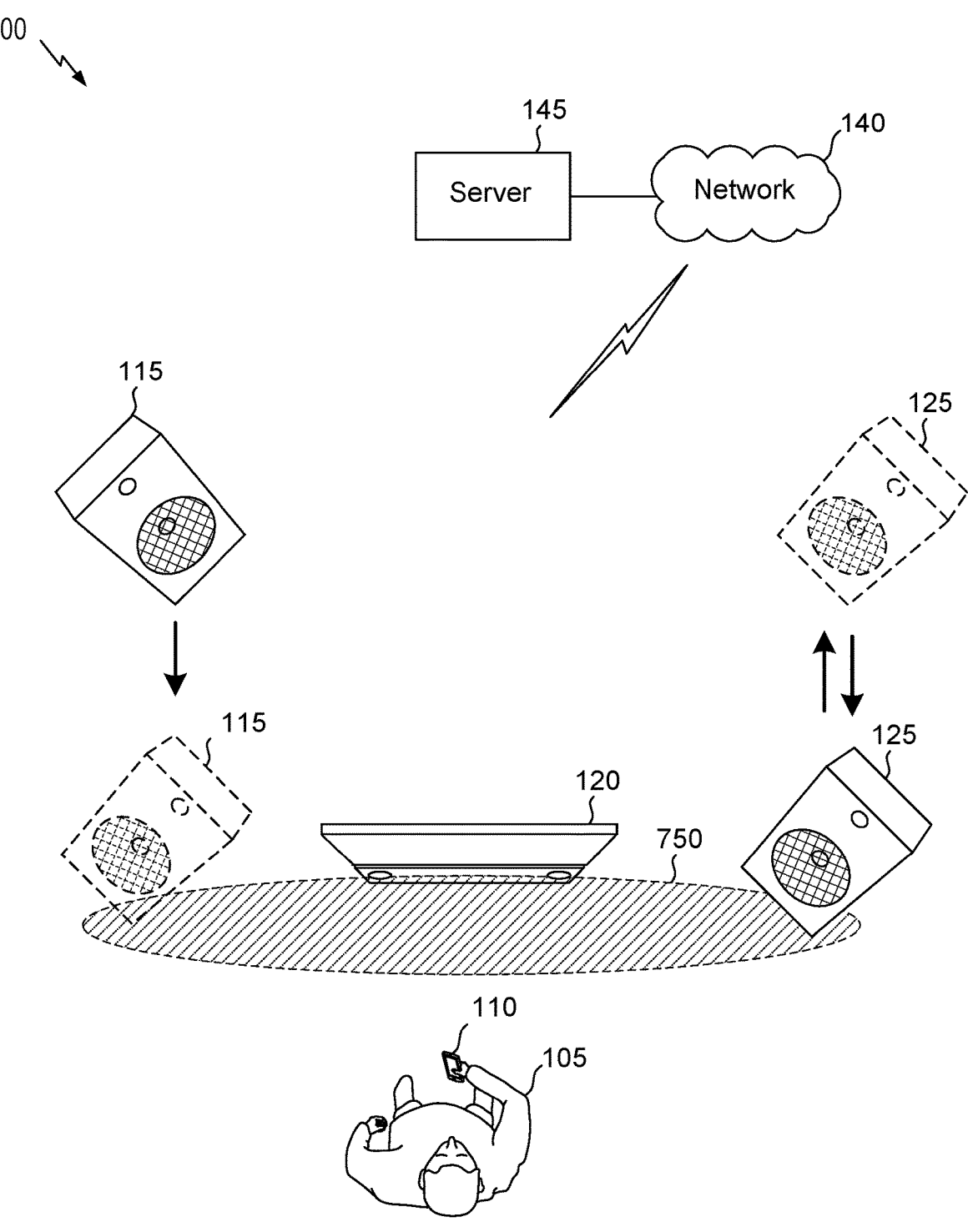
FIG. 7 depicts another example of an adaptively corrected sound field in the multimedia system of FIG. 4 with the incorrect loudspeakers positioning, according to one or more aspects.

In some aspects, however, when a loudspeaker is positioned "too far" (e.g., further than a configured, specified, target, or threshold listener-loudspeaker separation distance), a two-phase sound image correction may be performed, as shown in FIG. 7. The system may determine the listener-loudspeaker separation distances and, where the loudspeakers 115 and 125 are positioned incorrectly (e.g., as determined by the system based on the dynamic positioning information), the system applies a first dynamic gain and time delay to the loudspeaker 125 closest to the listener 105 to generate the sound field 750. For example, the system applies a first negative gain and a first positive time delay to the loudspeaker 125 to effectively "move back" the loudspeaker 125 to match the listener-loudspeaker separation distance of the loudspeaker 115, as shown in FIG. 6. In some aspects, the system applies first dynamic gains and time delays to all loudspeakers to match the listener-loudspeaker separation distance of the furthest loudspeaker. However, because in this example the loudspeaker 115 is positioned too far from the listener 105, the system then applies a second global gain (e.g., an equal positive gain applied to all loudspeakers within the local reproduction system), to effectively move the loudspeakers 115 and 125 closer to the listener to achieve the correct listener-loudspeaker separation distance.

In some aspects, the two-phase sound image correction may first apply a positive global time delay to all of the loudspeakers in the local reproduction system. The global time delay may be determined based on the listener-loudspeaker separation distance of the nearest loudspeaker to the listener. Then, a negative time delay may be applied to the loudspeakers further from the listener to effectively move the loudspeakers closer to the listener.

Figure 8:
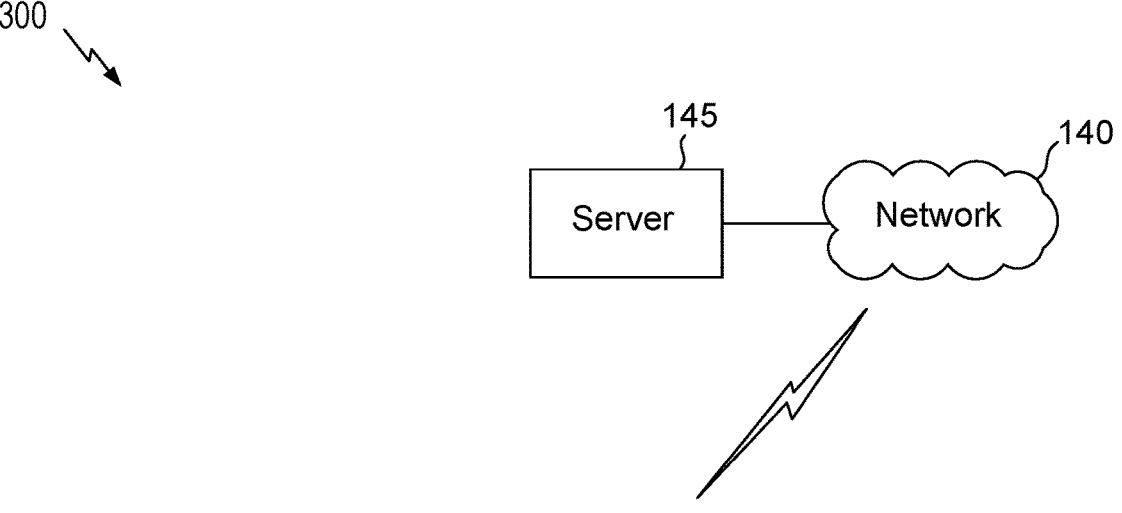
FIG. 8 depicts an example of an adaptively corrected sound field in the multimedia system of FIG. 5 with the incorrect listener positioning, according to one or more aspects.
Figure 8:
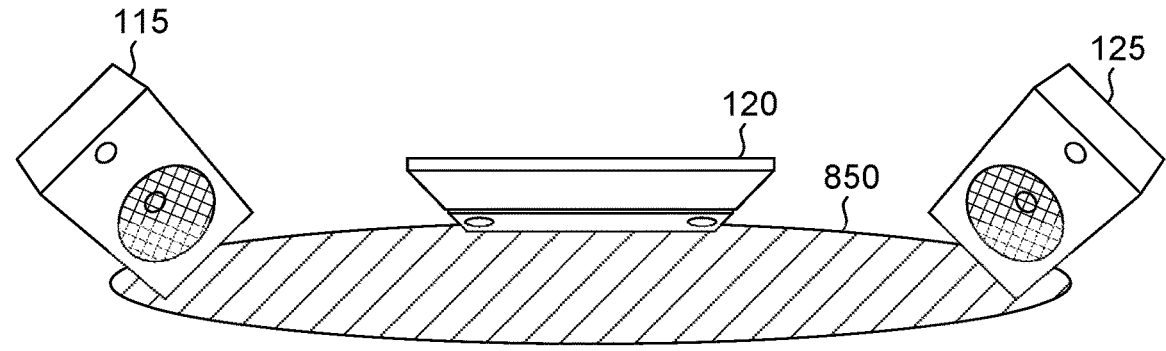
Figure 8:
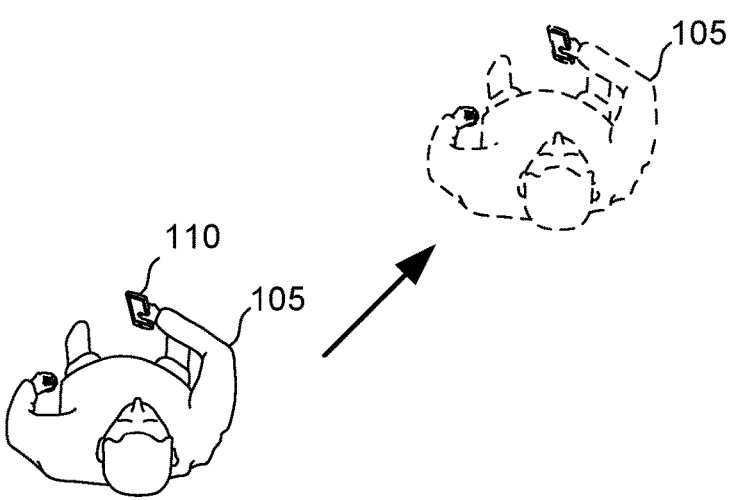

FIG. 8 depicts an example of an adaptively corrected sound field 850 in the multimedia system 300 of FIG. 5 with the listener 105 incorrectly positioned, according to one or more aspects. As shown in FIG. 8, by applying the adaptive sound image correction to compensate for the incorrect positioning of the listener 105, the corrected sound field 850 is produced such that the listener 105 perceives the desired sound image as though the listener 105 were correctly positioned.

Figure 9:
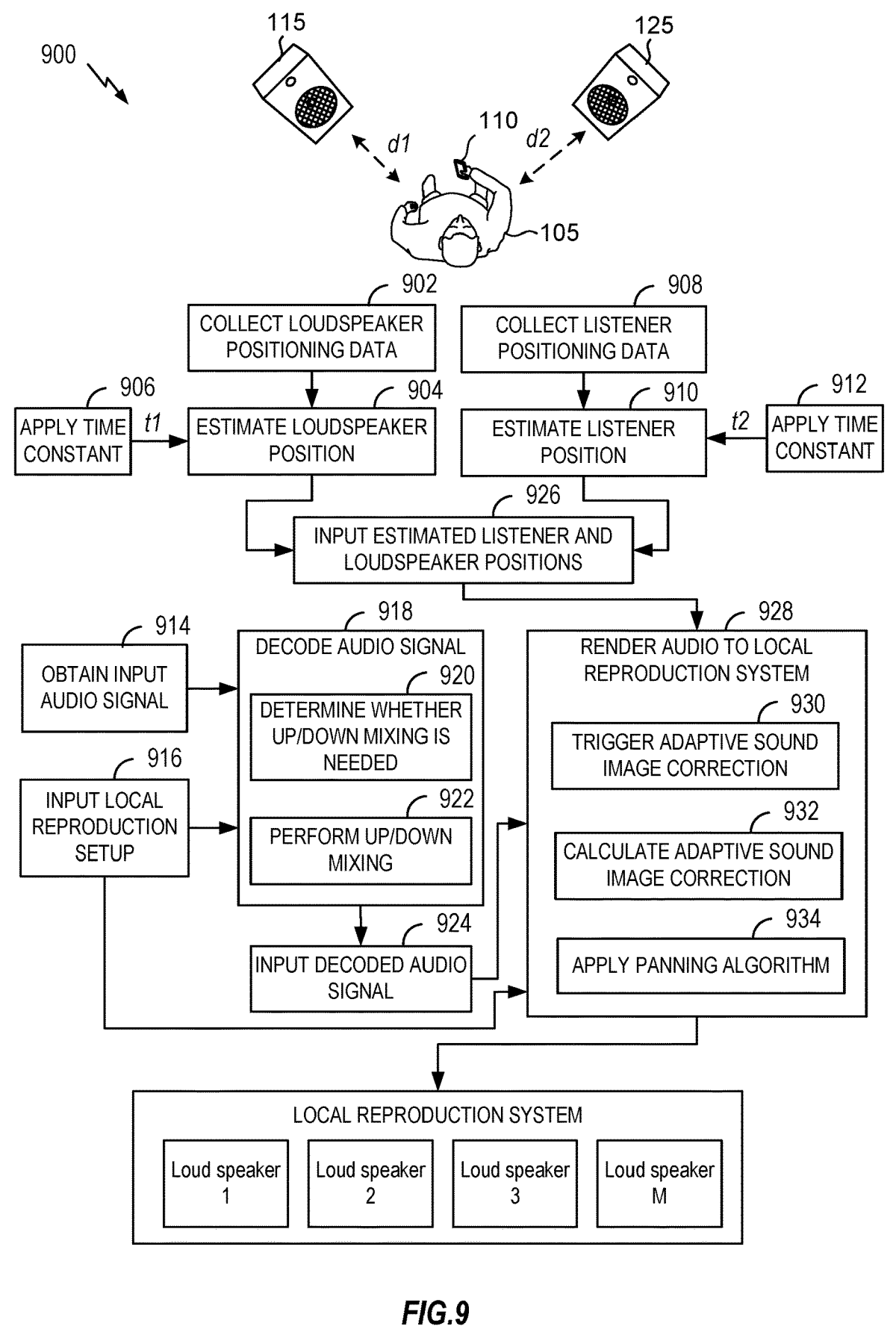

FIG. 9 depicts an example workflow 900 for adaptive sound image correction, according to one or more aspects. As shown in FIG. 9, the listener 105 has a first separation distance, d1, from the loudspeaker 115 and a second separation distance, d2, from the loudspeaker 125.

While FIG. 9 is discussed with respect to listener 105 and loudspeakers 115 and 125, it should be understood that the aspects herein may be performed for any number of listeners in a local reproduction system with any number of loudspeakers.

At 902, loudspeaker positioning data is dynamically collected. The loudspeaker positioning data may include position information of the loudspeakers 115 and 125. In some aspects, the dynamic loudspeaker positioning data is collected continuously by one or more local sensors. In some aspects, the dynamic loudspeaker positioning data collection is triggered, such as by motion detection. In some aspects, the dynamic loudspeaker positioning data is collected using local sensor technologies such as ultra wideband (UWB), Bluetooth, ultrasound, or other positioning technologies.

At 904, loudspeaker spatial positions are estimated based on the raw dynamic loudspeaker positioning data. In some aspects, the loudspeaker spatial positions are estimated in real-time (e.g., continuously or whenever the dynamic loudspeaker positioning data is received). In some aspects, the loudspeaker spatial position estimation is triggered, such as by a motion detection. In some aspects, a time constant, t1, is applied, at 906, to smooth the raw sensor data to reduce the sensitivity of the system. For example, the time constant may be used to filter out loudspeaker position data that occurs for a time duration smaller than the time constant threshold.

In some aspects, the loudspeaker position data is processed to produce spatial information, such as Cartesian coordinates (e.g., x- and y-coordinates or x-, y-, and z-coordinates) or spherical coordinates (e.g., Azimuth (in degrees) and distance (in meters) or Azimuth, distance, and elevation (in degrees)) of the loudspeakers. The Cartesian or spherical system may be defined around a reference point, such as a target loudspeaker position, a target listener position, or other reference point. In some aspects, the loudspeaker spatial positions are represented as a P-element array of the Cartesian or spherical coordinates, where P is the number of physical loudspeakers in the local reproduction setup.

In some aspects, the collection of the dynamic raw loudspeaker position data and the processing of the dynamic raw loudspeaker position data, at 902-906, may be performed at a single integrated device or across multiple devices. In some aspects, the device or system that collects and processes the dynamic raw loudspeaker position data is implemented on another device within the system. For example, the dynamic raw loudspeaker position data collection and processing may be implemented on a loudspeaker (e.g., one or multiple of the loudspeakers 115 and 125) within the local reproduction system (e.g., multimedia system 100) or implemented on a control unit within the system. In some aspects, the dynamic raw loudspeaker position data collection and processing may be implemented on a separate stand-alone device within the system. In some aspects, the dynamic raw loudspeaker position data processing could be performed outside of the system, such as by a remote server (e.g., server 145).

At 908, listener positioning data is dynamically collected. The listener positioning data may include position information of the listener 105. In some aspects, the dynamic listener positioning data is collected continuously by one or more local sensors. In some aspects, the dynamic listener positioning data collection is triggered, such as by motion detection. In some aspects, the dynamic listener positioning data is collected using local sensor technologies such as UWB, Bluetooth, ultrasound, or other positioning technologies.

At 910, listener spatial positions are estimated based on the raw dynamic listener positioning data. In some aspects, the listener spatial position is estimated in real-time (e.g., continuously or whenever the dynamic listener positioning data is received). In some aspects, the listener spatial position estimation is triggered, such as by a motion detection. In some aspects, a time constant, t2, is applied, at 912, to smooth the raw sensor data to reduce the sensitivity of the system. For example, the time constant may be used to filter out listener position data that occurs for a time duration smaller than the time constant threshold.

In some aspects, the listener position data is processed to produce spatial information, such as Cartesian coordinates (e.g., x- and y-coordinates or x-, y-, and z-coordinates) or spherical coordinates (e.g., Azimuth (in degrees) and distance (in meters) or Azimuth, distance, and elevation (in degrees)) of the loudspeakers. The Cartesian or spherical system may be defined around a reference point, such as a target loudspeaker position, a target listener position, or other reference point. In some aspects, the listener spatial positions are represented as a 1-element array of the Cartesian or spherical coordinates.

In some aspects, the collection of the dynamic raw listener position data and the processing of the dynamic raw listener position data, at 908-912, may be performed at a single integrated device or across multiple devices. In some aspects, the device or system that collects and processes the dynamic raw listener position data is implemented on another device within the system. For example, the dynamic raw listener position data collection and processing may be implemented on a loudspeaker (e.g., one or multiple of the loudspeakers 115 and 125) within the local reproduction system (e.g., multimedia system 100) or implemented on a control unit within the system. In some aspects, the dynamic raw listener position data collection and processing may be implemented on a separate stand-alone device within the system. In some aspects, the dynamic raw listener position data processing could be performed outside of the system, such as by a remote server (e.g., server 145).

The collection and processing of the raw dynamic loudspeaker positioning data, at 902-906, and the raw dynamic listener positioning data, at 908-912, may be performed at different time or at the same time. The collection and processing of the raw dynamic loudspeaker positioning data, at 902-906, and the raw dynamic listener positioning data, at 908-912, may be performed by the same sensors and devices or by different sensors and devices. In some aspects, raw separation distance data between the listener and the loudspeakers is dynamically collected and processed.

At 914, the system obtains an input audio signal. The audio signal may be a channel-based audio signal or an object-based audio signal. The input audio signal is associated with target loudspeaker positions for the decoded audio signals. For, object-based audio, the target loudspeaker positions are represented as a separate stream of data with time-varying positional data that informs any downstream renderers where each audio stream should be positioned in space. For channel-based audio, the target loudspeakers may be encoded in the audio signal and metadata may be provided by the decoder output or derived from the number of decoded audio channels.

At 916, local reproduction setup information is input to a decoder. The local reproduction setup information may include the number of available loudspeakers in the local reproduction system, positions (e.g., angle and/or distance) of the loudspeakers relative to a reference point, and/or capabilities of the loudspeaker. The capabilities of the loudspeakers may include a frequency response, a minimum output level, a maximum output level, and/or a sensitivity of the loudspeakers.

At 918, the input audio signal is decoded. In some aspects, the input audio signal is decoded based on the local reproduction setup information. For example, the system may determine how many output audio channel to decode. At 920, the system may determine whether upmixing or downmixing is needed based on the number of audio channels and the number of available loudspeakers within the local reproduction system. At 922, the system performs upmixing or downmixing on the audio signal based on the determination at 920. For an N-channel input audio signal, the decoder outputs an M channel audio signal, where M may be equal to (in the case of no upmixing or downmixing), larger than (in the case of upmixing), or smaller than N (in the case of downmixing). Where upmixing or downmixing is performed, the target spatial locations associated with the audio signal may be updated. The decoder may provide metadata with the target spatial locations or the updated target spatial locations with the output audio signal.

In some aspects, the decoding, at 918-922, may be performed at a single integrated device or across multiple devices. In some aspects, the device or system that decodes the input audio signal is implemented on another device within the system. For example, the decoding may be implemented on a loudspeaker (e.g., one or multiple of the loudspeakers 115 and 125) within the local reproduction system (e.g., multimedia system 100) or implemented on a control unit within the system. In some aspects, the decoding may be implemented on a separate stand-alone device within the system. In some aspects, the decoding may be performed outside of the system, such as by a remote server (e.g., server 145).

At 924, the decoded audio signal is input to a local reproduction system renderer. As shown in FIG. 9, the local reproduction setup information, at 916, is also provided to the local reproduction system renderer. In addition, at 926, the estimated listener and loudspeaker positions are input to the local reproduction system renderer. In some aspects, the estimated listener and loudspeaker positions are input to the local reproduction system renderer in real-time (e.g., immediately after being estimated at 904 and 910). In some aspects, the estimated listener and loudspeaker positions are input to the local reproduction system renderer upon a trigger (e.g., when the decoded audio signal is input to the renderer). In this case, the estimated listener and loudspeaker positions may be stored in memory until triggered to input to the local reproduction system renderer.

At 928, the decoded audio signal is rendered to the local reproduction system (e.g., to the loudspeakers 1 . . . M). The local reproduction system renderer renders the audio to the physical loudspeakers in the local reproduction system based on the estimated loudspeaker positions, the estimated listener positions, the target loudspeaker positions, and the local reproduction setup information. For example, at 934, the local reproduction system renderer applies a panning algorithm to map the M input audio signals with corresponding target spatial positions to P output audio signals to be reproduced by the P loudspeakers at the estimated spatial positions.

As shown in FIG. 9, the rendering may further include the adaptive sound image correction. At 930, the system may determine whether adaptive sound image correction is needed. For example, the system may determine whether adaptive sound image correction is needed based on the estimated listener and loudspeaker positions. In some aspects, the system determines adaptive sound image correction is not needed where the listener and loudspeakers are correctly positioned and determine the adaptive sound image correction is needed where listener and/or one or more loudspeakers are incorrectly positioned.

At 932, the system calculates the adaptive sound image correction. For example, the system may compute a delay and/or a gain to be applied to any of the P output channels to any of the P loudspeakers. The delay and/or the gain may be computed to correct for the incorrect listener and/or loudspeaker positioning. For example, the delay and/or the gain may be computed to compensate for the listener-loudspeaker separation distance, such that the sound field generated by the P loudspeakers matches, or attempts to match as closely possible, to a target or desired listener-loudspeaker separation distance. The computed gains and/or delays may then be applied to the respective audio signals.

In some aspects, the rendering, at 928-934, may be performed at a single integrated device or across multiple devices. In some aspects, the device or system that renders the decoded audio signal is implemented on another device within the system. For example, the rendering may be implemented on a loudspeaker (e.g., one or multiple of the loudspeakers 115 and 125) within the local reproduction system (e.g., multimedia system 100) or implemented on a control unit within the system. In some aspects, the rendering may be implemented on a separate stand-alone device within the system. In some aspects, the rendering may be performed outside of the system, such as by a remote server (e.g., server 145).

The aspects described herein provide a technical solution to a technical problem associated with incorrect loudspeaker and listener positioning. More specifically, implementing the aspects herein allows for adaptive loudspeaker and listener positioning compensation to correct for the incorrect loudspeaker and listener positioning. For example, with the adaptive loudspeaker and listener positioning compensation, one or more gains and/or one or more delays may be applied to an input audio signal to generate a sound field that a listener perceives as a desired or target sound image as though the listener-loudspeaker positioning were correct.

Example Method for Adaptive Loudspeaker and Listener Positioning Compensation

FIG. 10 is a flow diagram illustrating operations 1000 for adaptively correcting a sound image, according to one or more aspects. The operations 1000 may be understood with reference to the FIGS. 1-9.

Operations 1000 may begin, at operation 1002, with obtaining an audio signal. The audio signal may be associated with one or more audio channels. Each audio channel may be associated with a position of an audio source with respect to a reference point within a local reproduction system (e.g., multimedia system 100 with loudspeakers 115, 120, 125, 130, and 135).

Operations 1000 include, at operation 1004, determining dynamic position information. The dynamic position information includes positions of one or more loudspeakers within the local reproduction system relative to the reference point, a position of a listener (e.g., listener 105) relative to the reference point, positions of the one or more loudspeakers relative to the listener, or a combination thereof.

Operations 1000 include, at operation 1006, applying one or more correction gains and one or more correction time delays to the audio signal based on the dynamic position information.

Operations 1000 include, at operation 1008, rendering the audio signal to the local reproduction system.

In some aspects, determining the dynamic position information, at 1004, includes continuously collecting position data of the one or more loudspeakers, the listener, or both.

In some aspects, determining the dynamic position information, at 1004, includes collecting position data of the one or more loudspeakers, the listener, or both, based on detecting movement of the one or more loudspeakers, the listener, or a combination thereof.

In some aspects, determining the dynamic position information, at 1004, includes collecting position data of the one or more loudspeakers, the listener, or both, based on a trigger from a user. The trigger from the user may be a selection via a user interface or controller, a user gesture, or an acoustic command from the user.

In some aspects, determining the dynamic position information, at 1004, includes collecting raw position data of the one or more loudspeakers, the listener, or both; applying a time constant to smooth the raw position data; and estimating the positions of one or more loudspeakers within the local reproduction system relative to the reference point, the position of a listener relative to the reference point, the positions of the one or more loudspeakers relative to the listener, or the combination thereof, based on the smoothed positional data.

In some aspects, the dynamic position information includes X-, Y-, and Z-, Cartesian coordinates or spherical coordinates Azimuth (degrees), Elevation (degrees) and Distance (meters).

In some aspects, the dynamic position information indicates that at least one loudspeaker of the one or more loudspeakers, the listener, or both have a different position or different relative position than a respective target position. The target position may be a previously detected position, a target position for an audio channel, or a target position specified by a standard.

In some aspects, applying the one or more correction gains and the one or more correction time delays to the audio signal based on the dynamic position information, at 1006, includes determining a difference between the respective loudspeaker position or relative position or the listener position or relative position and the respective target position and applying a correction gain and a correction time delay to compensate for the difference. In some aspects, applying a correction gain and a correction time delay to compensate for the difference is based on a function, a mapping, or a look-up table that associates different correction gains and correction time delays to different difference values.

In some aspects, the one or more correction gains and the one or more correction time delays are determined at one or more loudspeakers within the local reproduction system, at a control unit within the local reproduction system, or at a remote server connected to the local reproduction system via a network.

Example Adaptive Loudspeaker and Listener Positioning Compensation Device

FIG. 11 depicts aspects of an example device 1100 for adaptive loudspeaker and listener positioning compensation. In some aspects, device 1100 is an input controller. In some aspects, device 1100 is a loudspeaker, such as one of the loudspeakers 115, 120, 125, 130, and 135 described above with respect to FIG. 1. While shown as a single device 1100, in some aspects, components of device 1100 may implemented across multiple physical devices with in a multimedia system, such as multimedia system 100 described above with respect to FIG. 1, and/or within a network, such as by server 145 within network 140.

The device 1100 includes a processing system 1102 coupled to a transceiver 1108 (e.g., a transmitter and/or a receiver). The transceiver 1108 is configured to transmit and receive signals for the device 1100 via an antenna 1110, such as the various signals as described herein. The processing system 1102 may be configured to perform processing functions for the device 1100, including processing signals received and/or to be transmitted by the device 1100.

The processing system 1102 includes one or more processors 1120. The one or more processors 1120 are coupled to a computer-readable medium/memory 1130 via a bus

1106. In certain aspects, the computer-readable medium/memory 1130 is configured to store instructions (e.g., computer-executable code) that when executed by the one or more processors 1120, cause the one or more processors 1120 to perform the operations 1000 described with respect to FIG. 10, or any aspect related to it. Note that reference to a processor performing a function of device 1100 may include one or more processors performing that function of device 1100.

The one or more processors 1120 include circuitry configured to implement (e.g., execute) the aspects described herein for adaptive sound image width enhancement, including circuitry for obtaining an audio signal 1121, circuitry for collecting listener and loudspeaker positional data 1122, circuitry for estimating listener and loudspeaker positions 1123, circuitry for computing adaptive sound image correction 1124, circuitry for applying adaptive sound image correction 1125, and circuitry for decoding 1126. Processing with circuitry 1121-1126 may cause the device 1100 to perform the operations 1000 described with respect to FIG. 10, or any aspect related to it.

In the depicted example, computer-readable medium/memory 1130 stores code (e.g., executable instructions). Processing of the code may cause the device 1100 to perform the operations 1000 described with respect to FIG. 10, or any aspect related to it. In addition, computer-readable medium/memory 1130 may store information that can be used by the processors 1120. For example, computer-readable medium/memory 1130 may store a panning algorithm 1131, local reproduction setup information 1132, listener and loudspeaker positions 1133, and time constant(s) 1134.

In addition, the device 1100 may include a local position sensor(s) 1140 configured to collect raw listener and loudspeaker position data provided to the circuitry for estimating the listener and loudspeaker positions 1123. The device 1100 may also include a wired audio input 1150 and a wired audio output 1160, for obtaining and outputting audio signals.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the general principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various actions may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more actions for achieving the methods. The method actions may be interchanged with one another without departing from the scope of the claims. In other words, unless a specific order of actions is specified, the order and/or use of specific actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for". All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

We claim:

1. A method of adaptively correcting a sound image, the method comprising:

obtaining an audio signal, wherein the audio signal is associated with one or more audio channels, and wherein each audio channel is associated with a position of an audio source with respect to a reference point within a local reproduction system;

receiving raw positioning data from an ultra-wideband (UWB) sensor, a Bluetooth sensor, a light detection and ranging (LiDAR) sensor, an ultrasound sensor, or a combination thereof, wherein the raw positioning data includes positioning data of a listener and positioning data of one or more loudspeakers within the local reproduction system;

determining dynamic position information from the raw positioning data, wherein the dynamic position information includes positions of the one or more loudspeakers within the local reproduction system relative to the reference point, a position of the listener relative to the reference point, positions of the one or more loudspeakers relative to the listener, or a combination thereof;

applying one or more correction gains and one or more correction time delays to the audio signal based on the dynamic position information, wherein applying the one or more correction gains and the one or more correction time delays to the audio signal based on the dynamic position information comprises:

applying a first negative gain and a respective first positive time delay to one or more first loudspeakers of the one or more loudspeakers based on respective differences between positions of the one or more first loudspeakers and a position of a second loudspeaker of the one or more loudspeakers that is furthest from the listener; and applying a second positive gain to the one or more first loudspeakers and the second loudspeaker based on the position of the second loudspeaker and a target position of the second loudspeaker; and rendering the audio signal to the local reproduction system.

2. The method of claim 1, wherein receiving the raw positioning data comprises continuously collecting the raw positioning data.

3. The method of claim 1, wherein receiving the raw positioning data comprises collecting the raw positioning data based on detecting movement of the one or more loudspeakers, the listener, or a combination thereof.

4. The method of claim 1, wherein receiving the raw positioning data comprises collecting the raw positioning data based on a trigger from a user.

5. The method of claim 4, wherein the trigger from the user comprises a selection via a user interface or controller, a user gesture, or an acoustic command from the user.

6. The method of claim 1, further comprising:

applying a time constant to smooth the raw positioning data; and estimating the positions of one or more loudspeakers within the local reproduction system relative to the reference point, the position of the listener relative to the reference point, the positions of the one or more loudspeakers relative to the listener, or the combination thereof, based on the smoothed positioning data.

7. The method of claim 1, wherein the dynamic position information comprises X-, Y-, and Z-Cartesian coordinates or Azimuth, elevation, and distance spherical coordinates.

8. The method of claim 1, wherein the dynamic position information indicates that at least one loudspeaker of the one or more loudspeakers has a different position than a respective target loudspeaker position, the listener has a different position than a respective target listener position, that a separation distance between the listener and at least one loudspeaker of the one or more loudspeakers is different than a target separation distance, or a combination thereof.

9. The method of claim 8, wherein:

the target loudspeaker position comprises a previously detected loudspeaker position, a target position for an audio channel, a target loudspeaker position specified by a standard, or a target loudspeaker position input by a user;

the target listener position comprises a previously detected listener position, a target listener position specified by a standard, or a target listener position input by the user;

the target separation distance comprises a previously detected separation distance, a target separation distance specified by a standard, or a target separation distance input by the user; or a combination thereof.

10. The method of claim 8, wherein applying the one or more correction gains and the one or more correction time delays to the audio signal based on the dynamic position information comprises:

determining a difference between the respective loudspeaker position and target loudspeaker position, listener position and target listener position, separation distance and target separation distance, or a combination thereof; and applying the first negative gain, the second positive gain, and the first positive time delay to compensate for the difference.

11. The method of claim 10, wherein applying the first negative gain, the second positive gain, and the first positive time delay to compensate for the difference is based on a function, a mapping, or a look-up table that associates different correction gains and correction time delays to difference values.

12. The method of claim 1, wherein the one or more correction gains and the one or more correction time delays are determined at one or more loudspeakers within the local reproduction system, at a control unit within the local reproduction system, or at a remote server connected to the local reproduction system via a network.

13. A system of adaptively correcting a sound image, the system comprising:

a plurality of loudspeakers at a plurality of positions within a local reproduction system;

at least one of: an ultra-wideband (UWB) sensor, a Bluetooth sensor, a light detection and ranging (Li-DAR) sensor, an ultrasound sensor, or a combination thereof configured to collect raw positioning data, wherein the raw positioning data includes positioning data of a listener and positioning data of one or more loudspeakers within the local reproduction system; and a processing system configured to:

obtain an audio signal, wherein the audio signal is associated with one or more audio channels, and wherein each audio channel is associated with a position of an audio source with respect to a reference point within the local reproduction system;

determine dynamic position information from the raw positioning data, wherein the dynamic position information includes positions of the one or more loudspeakers within the local reproduction system relative to the reference point, a position of the listener relative to the reference point, positions of the one or more loudspeakers relative to the listener, or a combination thereof;

apply one or more correction gains and one or more correction time delays to the audio signal based on the dynamic position information, wherein applying the one or more correction gains and the one or more correction time delays to the audio signal based on the dynamic position information comprises:

applying a first negative gain and a respective first positive time delay to one or more first loudspeakers of the one or more loudspeakers based on respective differences between positions of the one or more first loudspeakers and a position of a second loudspeaker of the one or more loudspeakers that is furthest from the listener; and applying a second positive gain to the one or more first loudspeakers and the second loudspeaker based on the position of the second loudspeaker and a target position of the second loudspeaker; and render the audio signal to the local reproduction system.

14. The system of claim 13, wherein the processing system being configured to receive the raw positioning data comprises the processing system being configured to continuously collect the raw positioning data.

15. The system of claim 13, wherein the processing system being configured to receive the raw positioning data comprises the processing system being configured to collect the raw positioning data based on detecting movement of the one or more loudspeakers, the listener, or a combination thereof.

16. The system of claim 13, wherein the processing system being configured to receive the raw positioning data comprises the processing system being configured to collect positioning data of the one or more loudspeakers, the listener, or both, based on a trigger from a user.

17. A loudspeaker, comprising:

a receiver configured to obtain an audio signal, wherein the audio signal is associated with one or more audio channels, and wherein each audio channel is associated with a position of an audio source with respect to a reference point within a local reproduction system;

adaptive sound image correction circuitry configured to:

obtain raw positioning data from an ultra-wideband (UWB) sensor, a Bluetooth sensor, a light detection and ranging (LiDAR) sensor, an ultrasound sensor, or a combination thereof, wherein the raw positioning data includes at a positioning data of a listener and positioning data of one or more loudspeakers within the local reproduction system;

determine dynamic position information from the raw positioning data, wherein the dynamic position information includes positions of the one or more loudspeakers within the local reproduction system relative to the reference point, a position of the listener relative to the reference point, positions of the one or more loudspeakers relative to the listener, or a combination thereof; and apply one or more correction gains and one or more correction time delays to the audio signal based on the dynamic position information, wherein applying the one or more correction gains and the one or more correction time delays to the audio signal based on the dynamic position information comprises:

applying a first negative gain and a respective first positive time delay to one or more first loudspeakers of the one or more loudspeakers based on respective differences between positions of the one or more first loudspeakers and a position of a second loudspeaker of the one or more loudspeakers that is furthest from the listener; and applying a second positive gain to the one or more first loudspeakers and the second loudspeaker based on the position of the second loudspeaker and a target position of the second loudspeaker;

a renderer configured to render the audio signal to the local reproduction system; and a transmitter configured to provide the rendered audio signal to the local reproduction system.

* * * * *